(12) United States Patent
Miller et al.

(10) Patent No.: US 11,424,367 B2
(45) Date of Patent: Aug. 23, 2022

(54) WRAP-AROUND CONTACTS INCLUDING LOCALIZED METAL SILICIDE

(71) Applicant: International Business Machines Corporation, Armonk, NY (US)

(72) Inventors: Eric Miller, Watervliet, NY (US); Julien Frougier, Albany, NY (US); Yann Mignot, Slingerlands, NY (US); Andrew M. Greene, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/124,458

(22) Filed: Dec. 16, 2020

(65) Prior Publication Data

US 2022/0190161 A1 Jun. 16, 2022

(51) Int. Cl.
*H01L 29/775* (2006.01)
*H01L 29/06* (2006.01)
(Continued)

(52) U.S. Cl.
CPC .. *H01L 29/7851* (2013.01); *H01L 21/823431* (2013.01); *H01L 21/823443* (2013.01);
(Continued)

(58) Field of Classification Search
CPC ......... H01L 21/02603; H01L 21/28052; H01L 21/28141; H01L 21/28518; H01L 21/32051; H01L 21/32053; H01L 21/823418; H01L 21/823431; H01L 21/823443; H01L 21/823468; H01L 21/823821; H01L 21/823835; H01L 21/823864; H01L 21/845; H01L 27/0886; H01L 27/0924; H01L 27/10879; H01L 27/1211; H01L 29/0642; H01L 29/0649; H01L 29/0653; H01L 29/0665; H01L 29/0669; H01L 29/0673; H01L 29/41791;
(Continued)

(56) References Cited

U.S. PATENT DOCUMENTS 9,318,581 B1 4/2016 Guo et al.
9,748,352 B2 8/2017 Liu et al.
(Continued)

OTHER PUBLICATIONS

Authorized Officer Li, Yuan, PRC National IP Administration as ISA, related PCT application PCT/CN2021/124804, ISR and Written Opinion, 9 pages total, dated Jan. 19, 2022.

*Primary Examiner* — David C Spalla
(74) *Attorney, Agent, or Firm* — Samuel Waldbaum; Otterstedt & Kammer PLLC

(57) ABSTRACT

A conformally deposited metal liner used for forming discrete, wrap-around contact structures is localized between pairs of gate structures and below the tops of the gate structures. Block mask patterning is employed to protect transistors over active regions of a substrate while portions of the metal liner between active regions are removed. A chamfering technique is employed to selectively remove further portions of the metal liner within the active regions. Metal silicide liners formed on the source/drain regions using the conformally deposited metal liner are electrically connected to source/drain contact metal following the deposition and patterning of a dielectric layer and subsequent metallization.

25 Claims, 14 Drawing Sheets

(51) Int. Cl.
*H01L 29/78* (2006.01)
*H01L 21/8234* (2006.01)
*H01L 21/768* (2006.01)
*H01L 29/66* (2006.01)

(52) U.S. Cl.
CPC .. *H01L 21/823468* (2013.01); *H01L 29/0649* (2013.01); *H01L 29/0665* (2013.01); *H01L 29/6656* (2013.01); *H01L 29/66795* (2013.01); *H01L 2029/7858* (2013.01)

(58) Field of Classification Search
CPC ........... H01L 29/66439; H01L 29/6653; H01L 29/66553; H01L 29/6656; H01L 29/66795; H01L 29/775; H01L 29/785; H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 9,847,390 B1 * | 12/2017 | Xie | ................... H01L 21/76897 |
| 9,953,979 B2 | 4/2018 | Xu et al. | |
| 10,193,090 B2 | 1/2019 | Lu et al. | |
| 10,236,218 B1 | 3/2019 | Xie et al. | |
| 10,276,442 B1 * | 4/2019 | Xie | ........... H01L 29/0653 |
| 10,361,277 B2 | 7/2019 | Adusumilli et al. | |
| 10,424,651 B2 | 9/2019 | Cheng et al. | |
| 10,497,792 B2 | 12/2019 | Diaz et al. | |
| 10,680,062 B2 | 6/2020 | Van Dal et al. | |
| 2017/0365604 A1 * | 12/2017 | Suh | ........... H01L 29/165 |
| 2019/0296129 A1 | 9/2019 | Cheng et al. | |
| 2019/0326395 A1 | 10/2019 | Ando et al. | |
| 2019/0341448 A1 | 11/2019 | Bourjot et al. | |
| 2020/0013681 A1 | 1/2020 | Lee et al. | |
| 2020/0051981 A1 * | 2/2020 | Yang | ................... H01L 27/0924 |
| 2020/0119180 A1 * | 4/2020 | Frougier | ........... H01L 29/66545 |
| 2020/0161574 A1 | 5/2020 | Vasen et al. | |
| 2020/0266271 A1 | 8/2020 | Lin et al. | |

* cited by examiner

WRAP-AROUND CONTACTS INCLUDING LOCALIZED METAL SILICIDE

BACKGROUND

The present invention relates generally to the electrical, electronic and computer arts and, more particularly, to field-effect transistors (FETs) including wrap-around contacts and their fabrication.

With shrinking dimensions of various integrated circuit components, transistors such as field-effect transistors (FETs) have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

FinFET, nanosheet and other FETs have been under development for possible use in tight pitch applications. Nanosheet FETs include multiple channel layers, each channel layer being separated by a gate stack including a layer of electrically conductive gate material and a gate dielectric layer. The gate stacks wrap around all sides of the channel layers, thereby forming a gate-all-around (GAA) structure. Epitaxial regions on the ends of the nanosheet channel layers form source/drain regions of the nanosheet FETs. Spacers are employed for electrically isolating the gates from the source/drain regions of nanosheet transistors. Fin-type field-effect transistors (FinFETs) have three-dimensional, non-planar configurations including fin-like structures extending above substrates. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is typically set by oxide thickness and etched fin height.

The contribution of middle-of-line (MOL) contact resistance to the total parasitic resistance is increasing due to aggressive dimensional scaling in advanced CMOS devices. Silicide/source-drain interface resistance can be a major contributor to the total external parasitic resistance. Increasing silicide contact length by wrapping around the total source-drain surface can reduce the overall contact resistance. Trench silicide (TS) liner coverage of a source-drain epitaxy as a wrap-around contact (WAC) to reduce spreading resistance may be important for designing advanced semiconductor devices. Conformal metallization processes using chemical vapor deposition (CVD) or atomic layer deposition (ALD) have been employed for forming metal contacts.

BRIEF SUMMARY

In accordance with one aspect of the invention, a method of forming a semiconductor structure including wrap-around contacts is provided. The method includes conformally depositing a metal liner on a monolithic structure, the monolithic structure including first and second active regions and field-effect transistors on the first and second active regions including gate structures and epitaxial source/drain regions. A metal silicide liner is formed on the epitaxial source/drain regions from the metal liner and wraps around these regions. The method further includes protecting the first and second active regions with a patterned block mask, selectively removing the metal liner from a region exposed by the patterned block mask between the first and second active regions, and removing the patterned block mask. A protective mask is formed on the monolithic structure such that the epitaxial source/drain regions are entirely beneath the top surface of the protective mask and portions of the metal liner above the first and second active regions are exposed. The exposed portions of the metal liner above the first and second active regions are selectively removed and the protective mask is then removed.

A further method of forming a semiconductor structure including wrap-around contacts includes obtaining a monolithic structure that includes first and second active regions, field-effect transistors on the first and second active regions including gate structures, gate caps above the gate structures, gate sidewall spacers on sidewalls of the gate structures, and epitaxial source/drain regions between pairs of gate structures, and a contiguous liner including first liner portions on and wrapping around the epitaxial source/drain regions and a metal liner extending between the first and second active regions and over the gate caps and gate sidewall spacers. The first and second active regions are protected with a patterned block mask. The metal liner is selectively removed from a region exposed by the patterned block mask between the first and second active regions followed by removal of the patterned block mask. A protective mask is formed on the monolithic structure such that the gate caps and top portions of the gate sidewall spacers extend above a top surface of the protective mask and the epitaxial source/drain regions are beneath the top surface of the protective mask. The metal liner is selectively removed from the top portions of the gate sidewall spacers and the gate caps and the protective mask is removed.

In a further aspect of the invention, a semiconductor structure is provided that includes a semiconductor substrate including a first active region and a second active region, a shallow trench isolation region between the first active region and the second active region, and a plurality of gate structures on the first active region. A first field-effect transistor on the first active region includes one of the gate structures on the first active region, a channel region, and a pair of epitaxial source/drain regions on opposite sides of the channel region, each epitaxial source/drain region being located between a pair of the gate structures on the first active region. A wrap-around metal silicide liner adjoins each epitaxial source/drain region. A dielectric layer extends over the semiconductor substrate and the first field-effect transistor. The semiconductor structure further includes metal liner portions contiguous, respectively, with each metal silicide liner, each metal liner portion including a vertically extending portion located between a pair of the gate structures on the first active region and extending above the source/drain regions and a horizontally extending portion below the source/drain regions of the first field-effect transistor and positioned between the shallow trench isolation region and the dielectric layer. The horizontally extending portion of each metal liner portion extends laterally beyond one of the source/drain regions of the first field-effect transistor.

A semiconductor structure in accordance with a further aspect includes a semiconductor substrate including a first active region and a second active region, a plurality of parallel gate structures extending across the semiconductor substrate, a first field-effect transistor on the first active region, the first field-effect transistor comprising one of the gate structures, a channel region, and a first pair of epitaxial source/drain regions on opposite sides of the channel region. Each epitaxial source/drain region is located between a first pair of the gate structures. The semiconductor structure further includes a second field-effect transistor on the second active region wherein the second field-effect transistor includes one of the gate structures, a channel region, and a second pair of epitaxial source/drain regions on opposite sides of the channel region, each epitaxial source/drain region being located between a second pair of the gate structures. A dielectric liner encases the first field-effect transistor and the second field-effect transistor. A metal silicide layer is wrapped around each of the source/drain regions of the first and second field-effect transistors. A conformal metal liner extends from and is contiguous with each metal silicide liner. Each conformal metal layer includes a vertically extending portion confined between a pair of the gate structures and extending vertically above one of the source/drain regions, the pair of the gate structures extending vertically above the vertically extending portion of each conformal metal liner. Source/drain contact metal extends vertically through the dielectric layer and contacts the metal silicide liner.

Techniques and structures as disclosed herein can provide substantial beneficial technical effects. By way of example only and without limitation, one or more embodiments may provide one or more of the following advantages:

Discrete wrap-around contacts with robust and simple integration;
Reducing number of extreme ultraviolet lithography (EUVL) levels;
Circumventing possible issues associated with inverse tone patterning.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

An exemplary sequence of steps that may be employed for forming wrap-around contacts (WACs) is shown in the figures. While the disclosed method and the resulting structure relate to GAA nanosheet architectures, the principles of the inventions can also be applied to other FET architectures such as FinFETs.

Figure 1A:
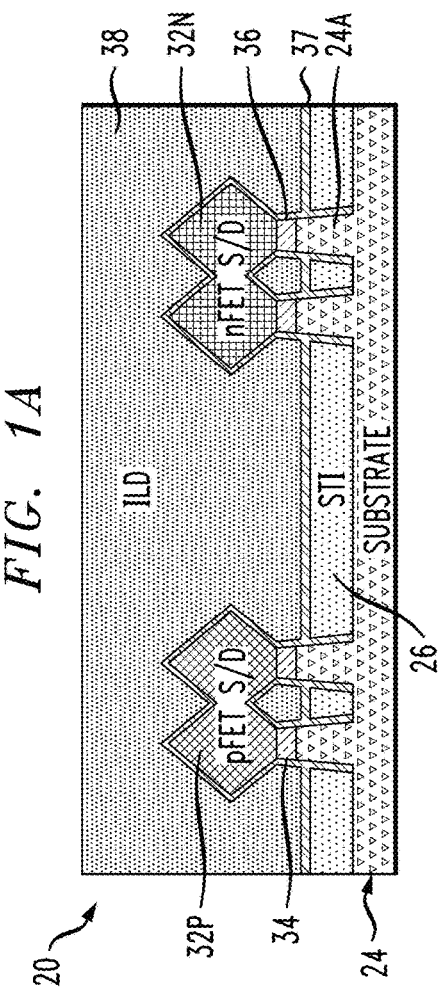
FIG. 1A is a schematic, cross-sectional view taken along line X of FIG. 1 showing further elements of the monolithic semiconductor structure.
Figure 1B:
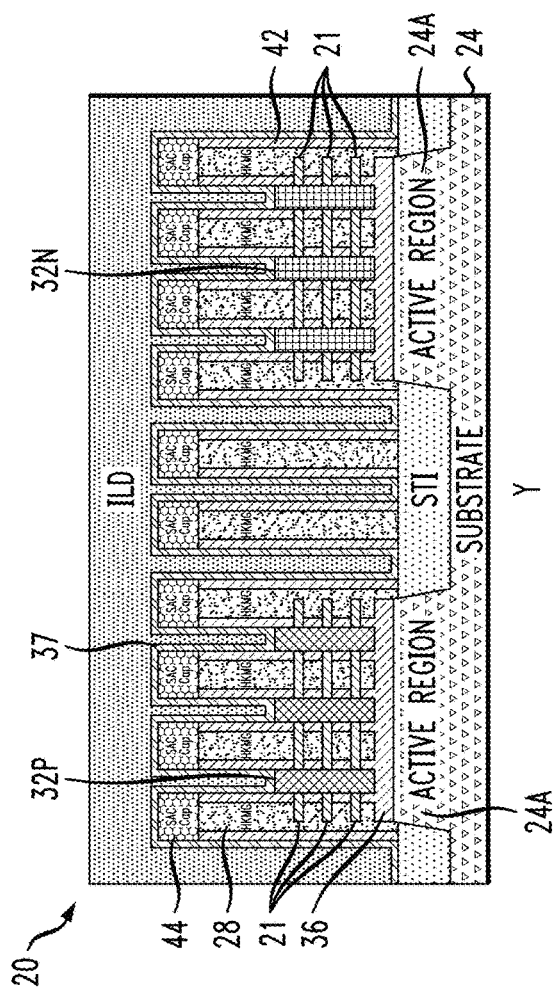
FIG. 1B is a schematic, cross-sectional view taken along line Y of FIG. 1 showing further elements of the monolithic semiconductor structure.
Figure 1:
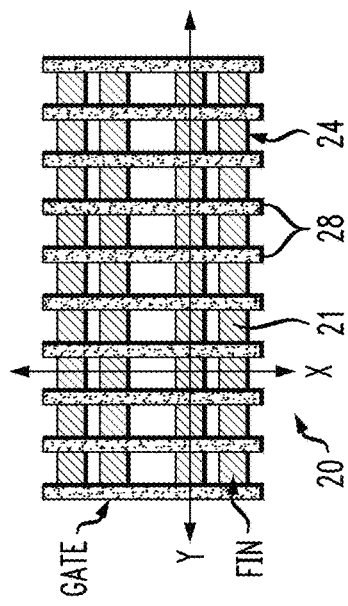
FIG. 1 is a schematic, top plan view showing selected elements of a monolithic semiconductor structure.

An exemplary monolithic structure 20 as shown in FIGS. 1, 1A and 1B may be obtained during a fabrication process in which GAA nanosheet architectures are provided. Various techniques are known to the art for fabricating such architectures and similar architectures and new techniques continue to be developed. The exemplary structure 20 includes pFETs and nFETs, each including a stack of alternating semiconductor channel layers 21 (shown in cross-section in FIG. 1B). The semiconductor channel layers 21 may be, for example, silicon nanosheets. The nanosheets can be formed on a semiconductor-on-insulator substrate or on a bulk semiconductor substrate such as a bulk silicon substrate. Shallow trench isolation (STI) regions 26 formed within the substrate 24 provide electrical isolation of active regions including neighboring transistors or other devices that may be formed on the substrate. In an exemplary embodiment, the active regions 24A of the substrate 24 comprise monocrystalline silicon fins, though impurities may be present within the crystalline structure. Single crystal silicon wafers are commercially available and are characterized by a diamond cube lattice structure. As known in the art, the Miller indices of a substrate are determined from the reciprocals of the points at which the crystal plane of silicon intersects the principal crystalline axes. Exemplary embodiments as described herein relate to structures including doped or undoped (100) silicon as a substrate material.

In one or more exemplary embodiments, the semiconductor channel layers 21 each have a thickness in the range of four to ten nanometers (4-10 nm). The number of semiconductor (channel) layers in the semiconductor layer stack may vary depending on the desired uses and capabilities of the nanosheet transistors to be fabricated. The channel layers 21 may consist essentially of monocrystalline silicon layers, possibly including impurities, and are spaced six to twenty nanometers (6-20 nm) apart in some embodiments. The width of each semiconductor channel layer 21 is about twenty to fifty nanometers (20-50 nm) in some embodiments, though this range should be considered exemplary as opposed to restrictive.

Fabrication of the structure 20 may include replacing sacrificial silicon germanium layers (not shown) between the channel layers 21 by metal gate and gate dielectric materials that form gate-all-around structures (gate stacks) 28 as schematically illustrated in FIGS. 1 and 1B. Silicon and silicon germanium layers can be epitaxially grown in alternating sequence to obtain a vertical stack having the desired number of silicon (channel) layers. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The gate structures 28 may have a thickness in the range of six to twenty nanometers (6-20 nm). The dimension ranges of the channel layers and gate structures should be considered exemplary as opposed to limiting. A gate dielectric layer forms portions of the gate stacks 28 that replace the sacrificial silicon germanium layers. The gate stacks adjoin the silicon nanosheet channel layers 21 and extend down to a bottom dielectric isolation (BDI) layer 36 and/or the STI region 26. Non-limiting examples of suitable materials for the gate dielectric layer include oxides, nitrides, oxynitrides, silicates (e.g., metal silicates), aluminates, titanates, nitrides, or any combination thereof. Examples of high-k gate dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In one exemplary embodiment, a high-k dielectric layer having a thickness of 2.5 nm is employed. In some embodiments, the gate dielectric layer incudes multiple layers.

Source/drain regions 32P, 32N are epitaxially grown on the exposed edges of the silicon (channel) layers 21 and may be merged. The source/drain regions are electrically isolated from the substrate 24 by the bottom dielectric isolation (BDI) layer 36. Dopants within the source/drain regions 32 may be incorporated in situ using appropriate precursors, as known in the art. By "in-situ" it is meant that the dopant that dictates the conductivity type of a doped layer is introduced during the process step, for example epitaxial deposition, that forms the doped layer. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. In a silicon-containing substrate, examples of n-type dopants, i.e., impurities, include but are not limited to antimony, arsenic and phosphorous. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). An nFET region(s) includes transistors having n-type source/drain regions while the pFET region(s) includes p-type source/drain regions. The use of a BDI layer 36 is optional to the fabrication of nFET and pFET transistors as described herein.

The monolithic structure 20 further includes a contact etching stop layer (CESL) that is formed as a liner thereon subsequent to source/drain epitaxy. The CESL liner 37 is formed, in some embodiments, by depositing a conformal layer of silicon nitride, low-k dielectric materials such as silicon-carbon-boron-nitrogen (SiCBN), silicon oxycarbide (SiOC) or silicon-carbon-oxynitride (SiCON), over and between source-drain regions 32P, 32N.

Next, an interlayer dielectric (ILD) 38, for example silicon dioxide ($SiO_2$) or any other material with similar functional properties, is formed by chemical vapor deposition (CVD) or any other suitable deposition technique, over the source-drain regions and the CESL liner 37. The structure 20 further includes dielectric gate sidewall spacers 42 and gate caps 44, as shown in FIG. 1B. Techniques for forming such spacers and gate caps are known to the art. The CESL liner 37 also extends over the gate sidewall spacers and the gate caps. Following planarization of the gate cap layer from which the gate caps are formed and deposition of an oxide fill, the elements discussed above are embedded within the ILD layer 38 as shown in FIGS. 1A and 1B.

Figure 2A:
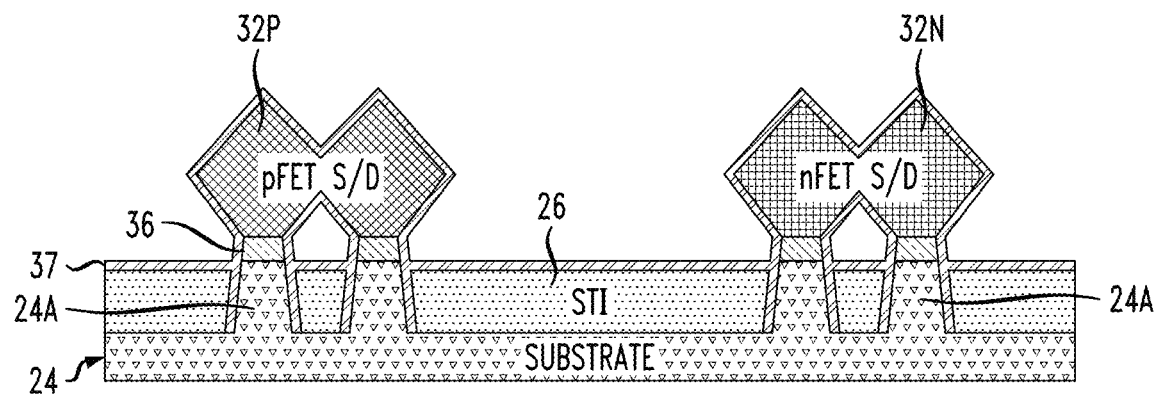
FIG. 2A is a schematic, cross-sectional view of the structure shown in FIG. 1A following a selective oxide etch.
Figure 2B:
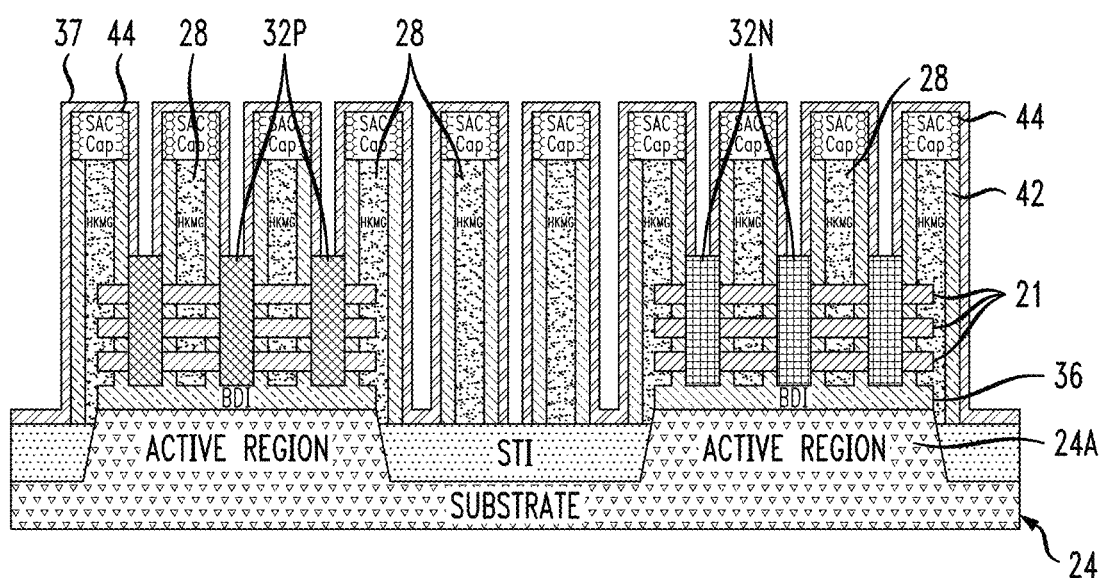
FIG. 2B is a schematic, cross-sectional view of the structure shown in FIG. 1B following the selective oxide etch.

Referring to FIGS. 2A and 2B, the ILD layer 38 is selectively removed using, for example, a wet hydrofluoric (HF) acid etch or any other suitable etch. The CESL liner 37 is then selectively removed to obtain a structure 30 as schematically illustrated in cross-section in FIG. 3A and FIG. 3B. A wet phosphoric acid etch or other suitable etch may be employed to selectively remove the CESL liner 37 in one or more embodiments.

A TS liner wrapping around the source/drain regions 32P, 32N may be formed by conformal deposition of a titanium (Ti) liner 46 or other suitable metal liner using CVD. Deposition of the liner 46 may be followed by an annealing step at this stage of the process or later to form titanium silicide and/or titanium-based germano-silicide layers on the source/drain regions.

Figure 4A:
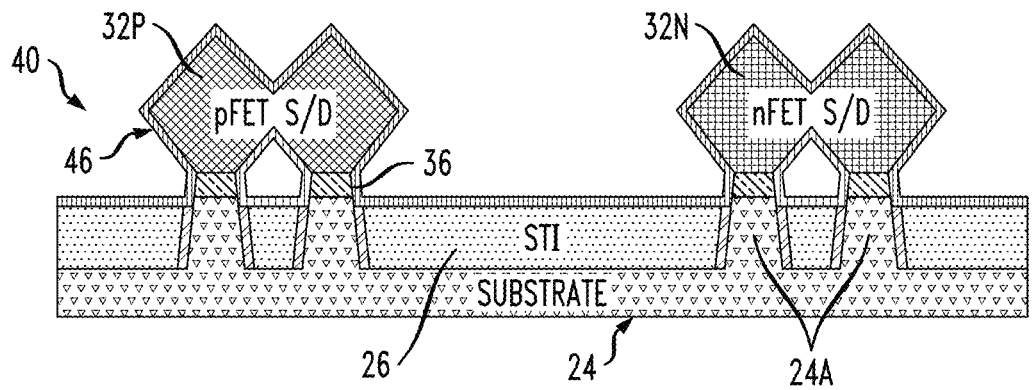
FIG. 4A is a schematic, cross-sectional view of the structure as shown in FIG. 3A following formation of a silicide liner around source/drain regions thereof.
Figure 4B:
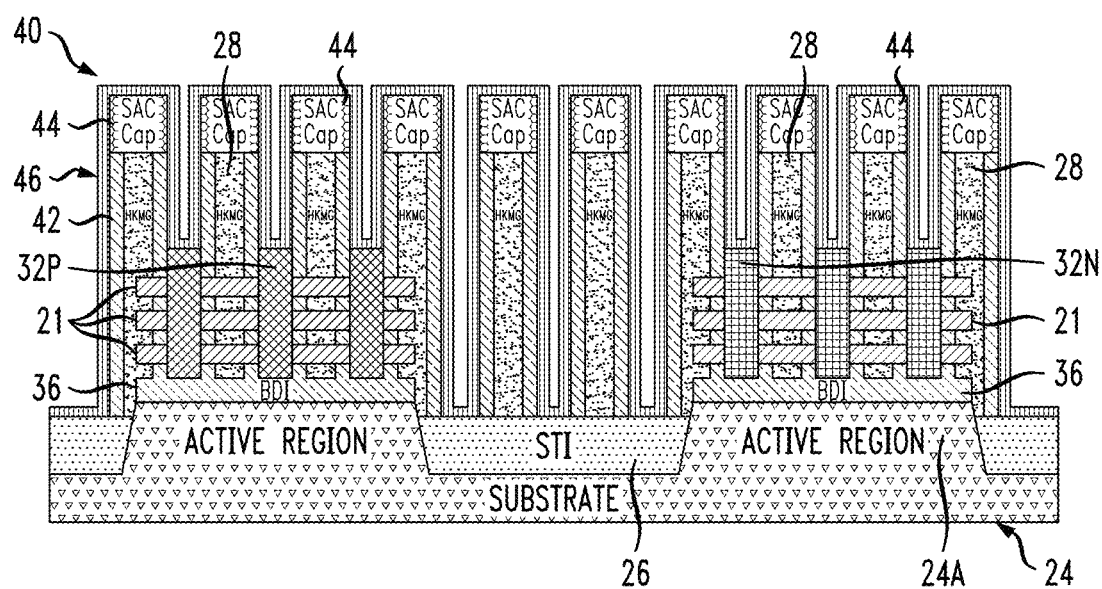
FIG. 4B is a schematic, cross-sectional view of the structure as shown in FIG. 3B following deposition of a metal liner.

A conformal film is understood as having substantially uniform thickness. In some exemplary structures including both nFET and pFET regions, annealing causes the source/drain regions within the nFET region to include $TiS_2$ layers while titanium germano-silicide ($Ti(SiGe)_2$) layers are formed on the source/drain regions in the pFET region. The terms titanium silicide and metal silicide as used hereafter are intended to encompass silicides formed on either silicon or silicon germanium. The thickness of the Ti liner 46 may, for example, be in the range of two to five nanometers (2 nm to 5 nm). The liner further extends over the STI region 26, the gate sidewall spacers 42, and the gate caps 44 as illustrated in FIGS. 4A and 4B. A structure 40 is thereby obtained.

Figure 5A:
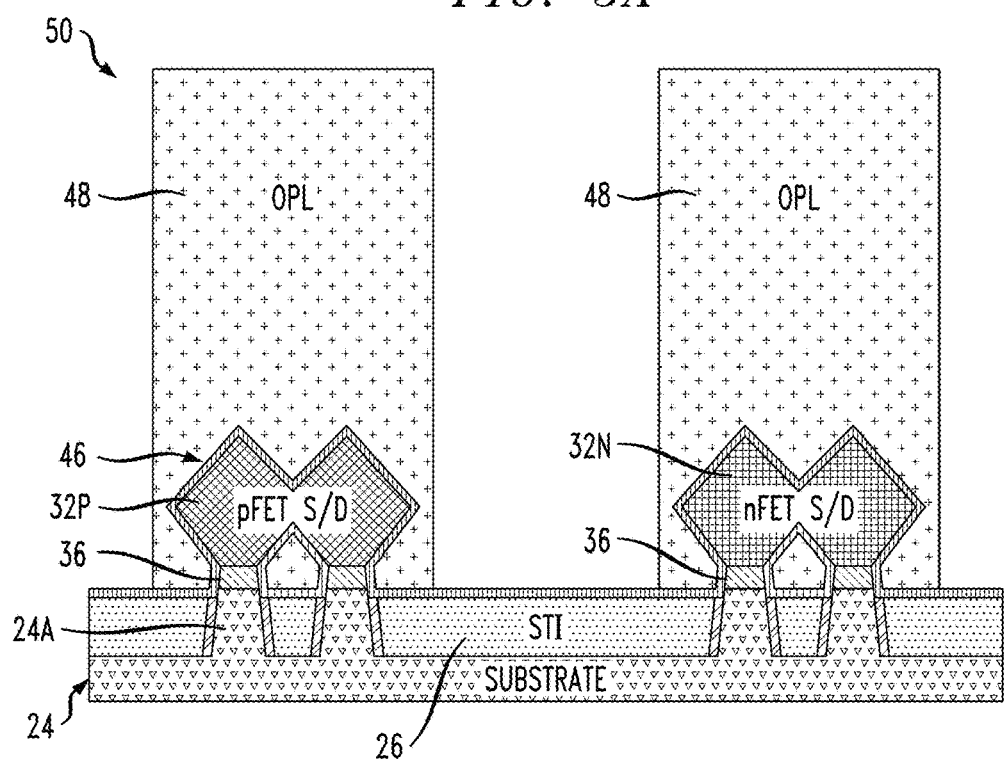
FIG. 5A is a schematic, cross-sectional view of the structure as shown in FIG. 4A following deposition and patterning of a block mask thereon.
Figure 5B:
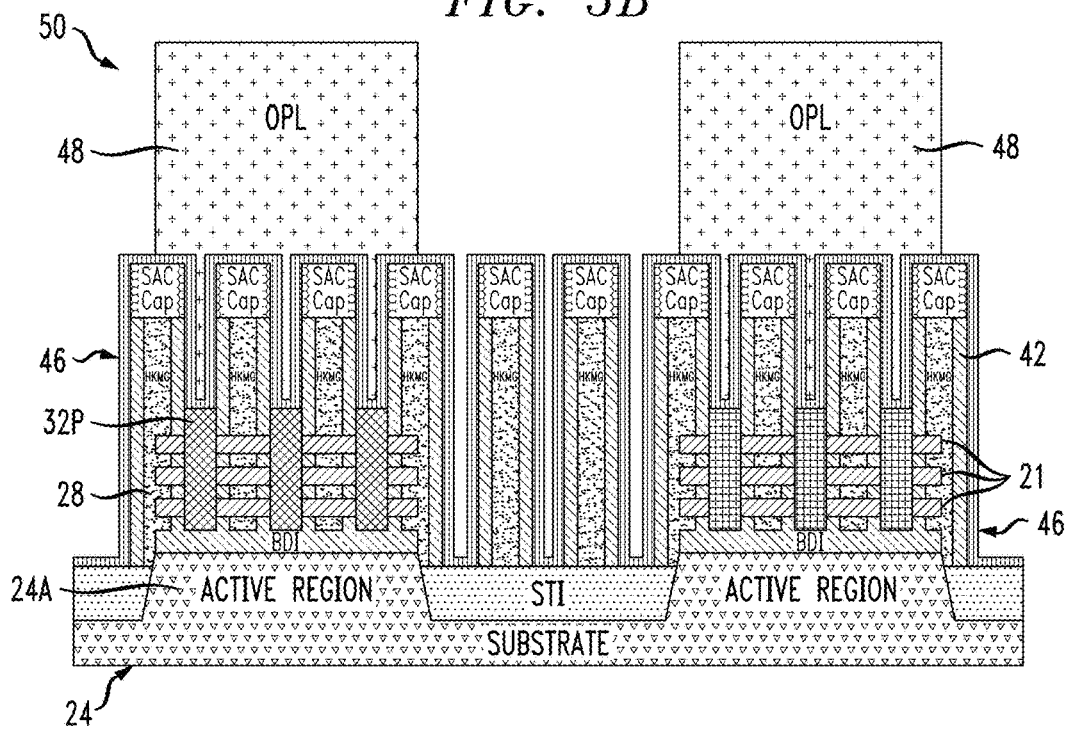
FIG. 5B is a schematic, cross-sectional view of the structure as shown in FIG. 4B following deposition and patterning of a block mask thereon.

An organic planarization layer (OPL) 48 is deposited on the structure 40 and patterned to form a block mask. In accordance with an embodiment of the present invention, the OPL 48 may be an organic polymer including carbon, hydrogen and nitrogen. Non-limiting examples of the OPL material include JSR HM8006, JSR HM8014, AZ UM10M2, Shin Etsu ODL 102, or other similar commercially available materials from such vendors as JSR, TOK, Sumitomo, and Rohm & Haas. The OPL 48 can be deposited, for example, by spin coating and excess material is etched back. As shown in FIGS. 5A and 5B, the remaining portions of the OPL form a block mask that extends over and protects the active regions 24A of the substrate 24. The source/drain regions 32P, 32N, the portions of the liner 46 wrapping around the source/drain regions, and the gate structures on the active regions are embedded within the patterned OPL and therefore protected. The patterned OPL extends over as well as laterally beyond the source/drain regions, as shown in FIG. 5A, while leaving a horizontal portion of the titanium liner 46 between the pFET and nFET active regions exposed. The portions of the titanium liner 46 extending over the STI region 26 and gate structures 28 located between the active regions are exposed following OPL patterning in the resulting structure 50.

Figure 6A:
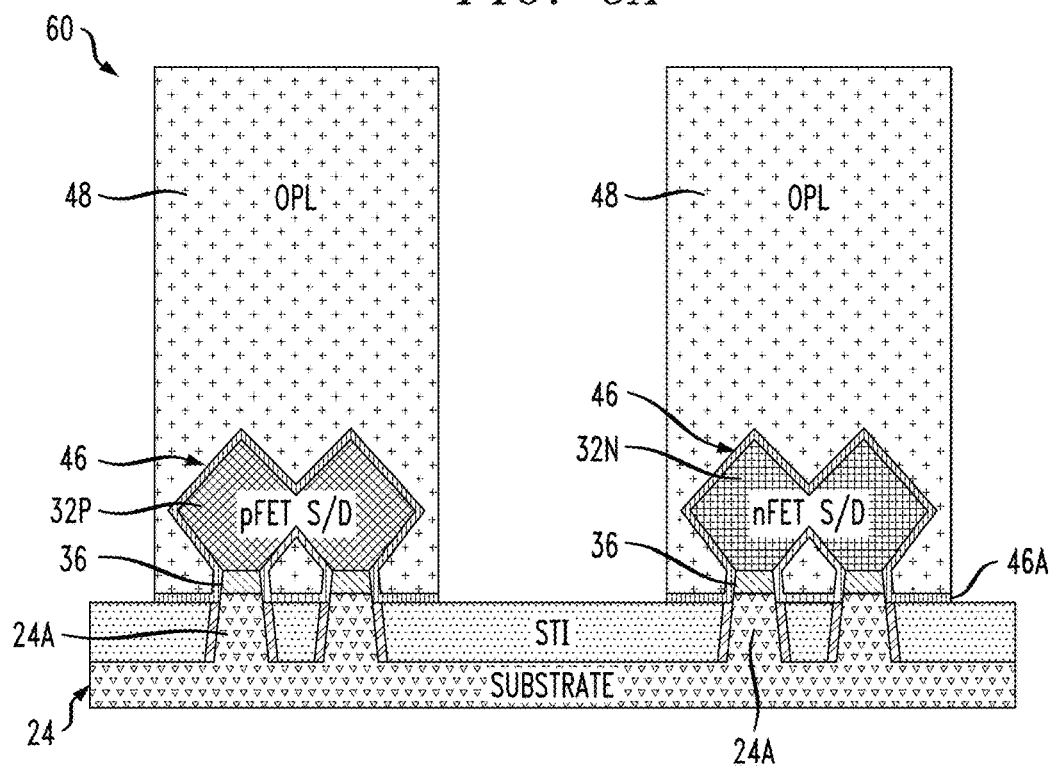
FIG. 6A is a schematic, cross-sectional view of the structure as shown in FIG. 5A following selective removal of the metal liner in between active regions thereof.
Figure 6B:
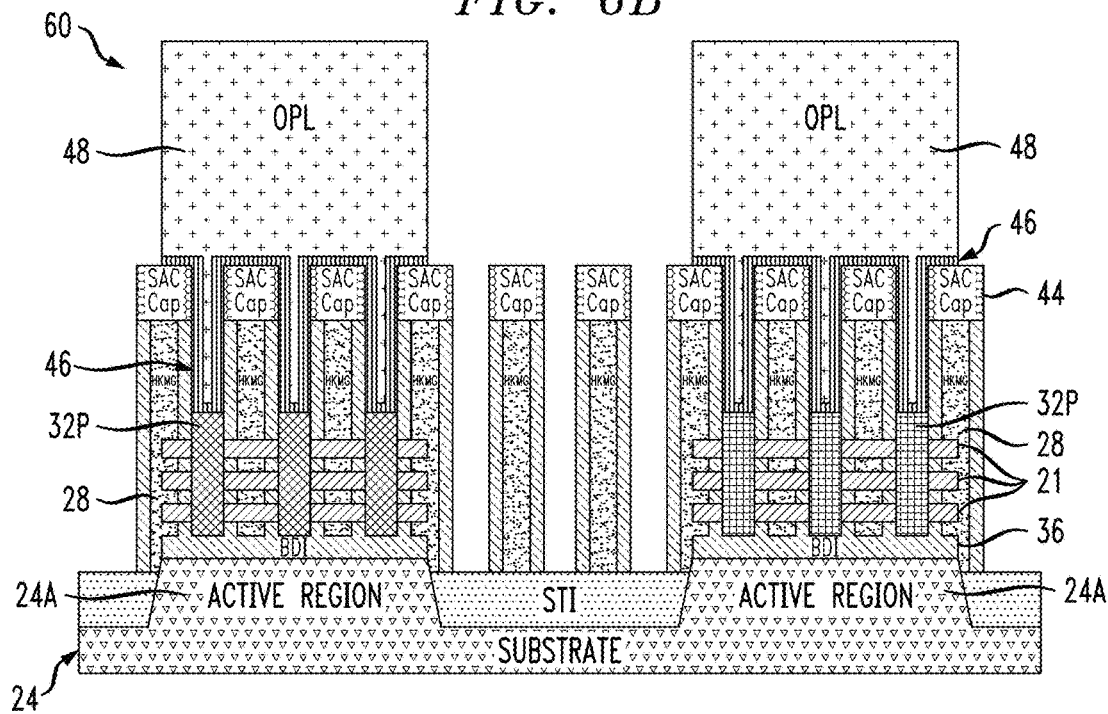
FIG. 6B is a schematic, cross-sectional view of the structure as shown in FIG. 5B following selective removal of the metal liner in between active regions thereof.
Figure 7A:
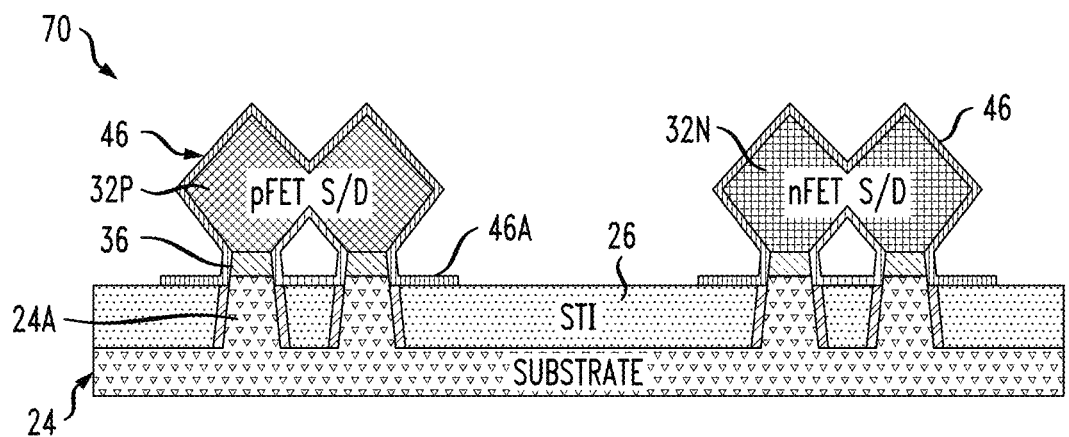
FIG. 7A is a schematic, cross-sectional view of the structure as shown in FIG. 7A following removal of the patterned block mask.
Figure 7B:
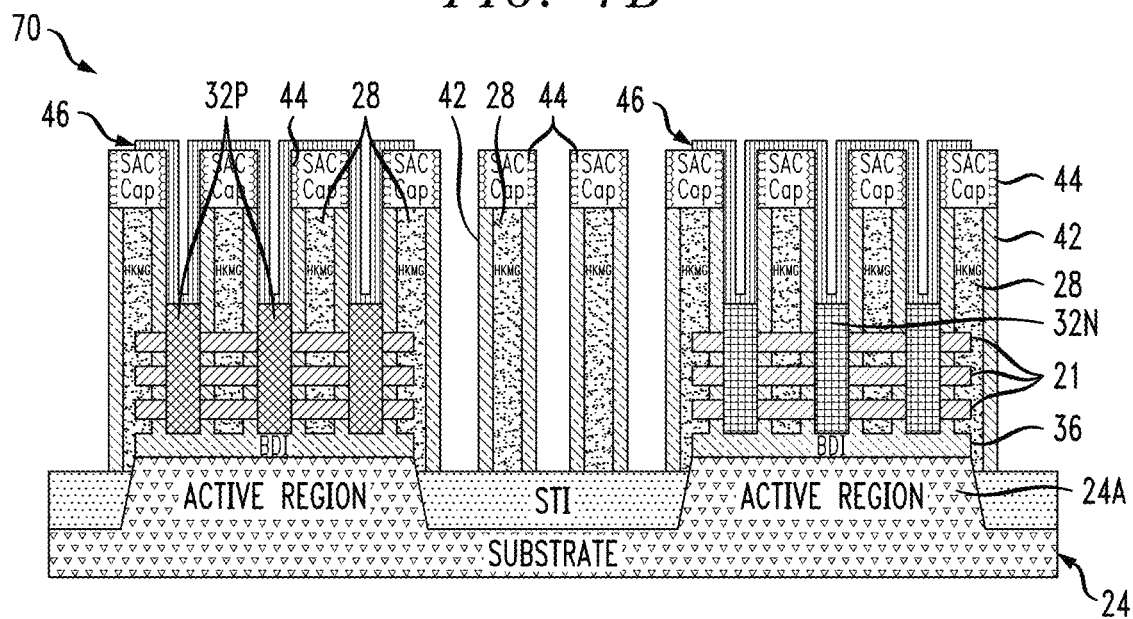
FIG. 7B is a schematic, cross-sectional view of the structure as shown in FIG. 6B following removal of the patterned block mask.

The exposed portions of the titanium liner 46 between active regions 24A are selectively removed. The selective removal of titanium-based material may be conducted by a wet process using, for example, sulfuric peroxide mixture (SPM), which combines the use of sulfuric acid and hydrogen peroxide. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process and preferably much greater. A structure 60 as schematically illustrated in cross-section in FIGS. 6A and 6B may accordingly be obtained. Removal of the OPL 48 from the structure 60 re-exposes titanium-covered source/drain regions 32P, 32N and other structures above the active regions 24A of the substrate 24. A structure 70 as schematically illustrated in FIGS. 7A and 7B may be obtained. As shown in FIG. 7A, the metal liner 46 now includes horizontal segments 46A extending partially over the STI region 26 and laterally beyond the lateral end portions of the source/drain regions directly above them.

Figure 8A:
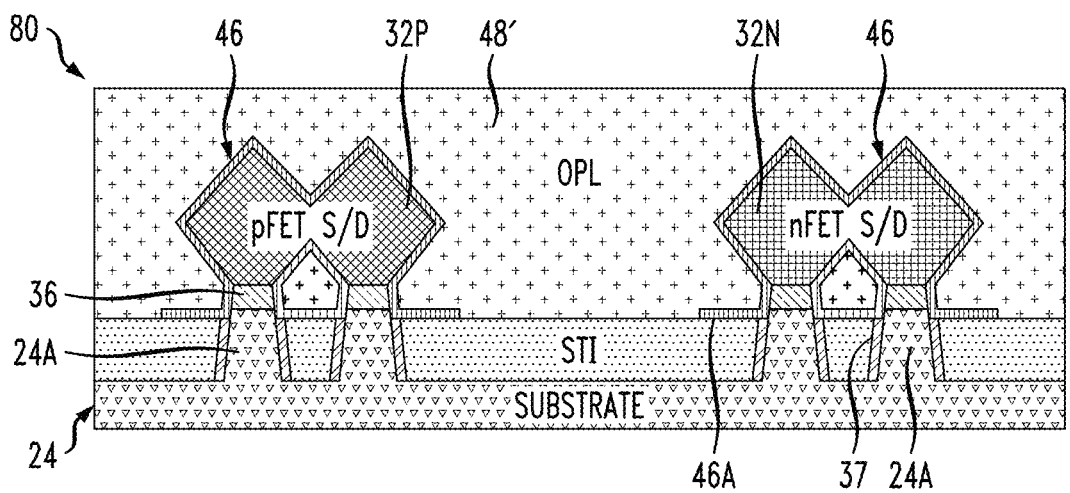
FIG. 8A is a schematic, cross-sectional view of the structure as shown in FIG. 7A following deposition of the organic planarization layer (OPL) and partial etch-back thereof.
Figure 8B:
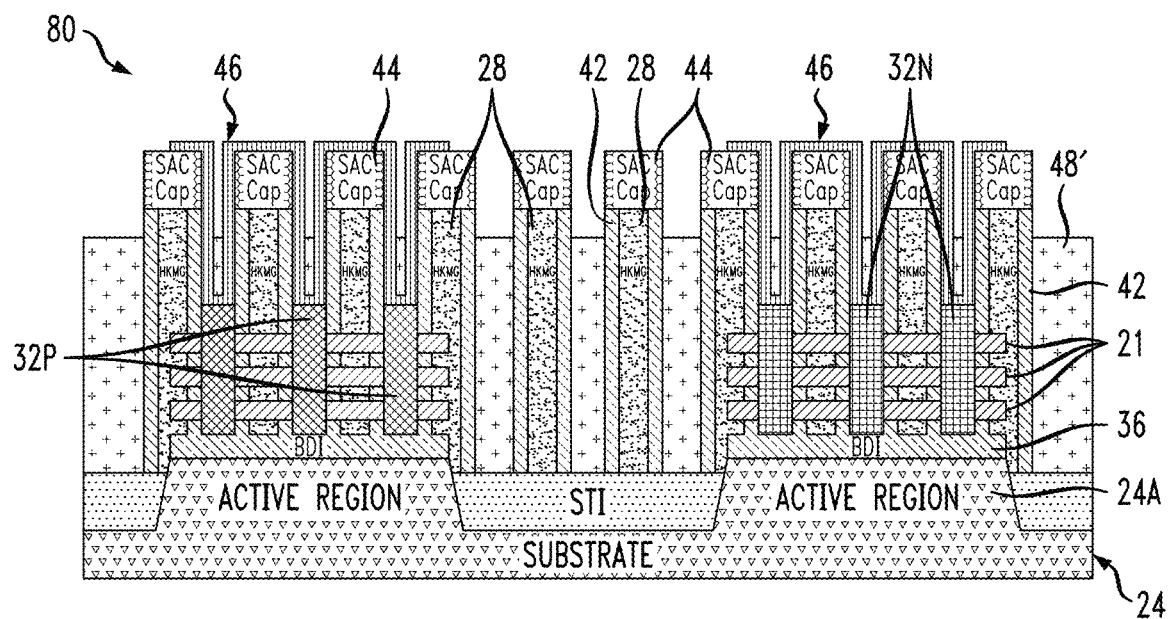
FIG. 8B is a schematic, cross-sectional view of the structure as shown in FIG. 7B following deposition of the organic planarization layer (OPL) and partial etch-back thereof.

A further organic planarization layer 48' is deposited and etched back to obtain a structure 80 as schematically illustrated in FIGS. 8A and 8B. The OPL 48' may, but does not necessarily comprise the same materials as the OPL 48 discussed above. It may be deposited in the same manner or using a different technique. As shown in FIGS. 8A and 8B, the thickness of the OPL 48' is sufficient that the source/drain regions 32P, 32N, including the titanium (silicide) layer 48 thereon, are embedded within the OPL and are therefore protected. Portions of the gate structures 28 and the gate sidewall spacers 42 extend above the top surface of the OPL. The titanium-covered gate caps 44 formed over the active regions 24A are entirely exposed. By providing sufficient uniformity of the recessed OPL 48' below the top surfaces of the gate caps 44 across a wafer on which the field-effect transistors are formed, the portions of the titanium layer 46 on the gate caps 44 are entirely exposed while none of the titanium (or silicide) on the epitaxial source/drain regions 32P, 32N is exposed.

Figure 9A:
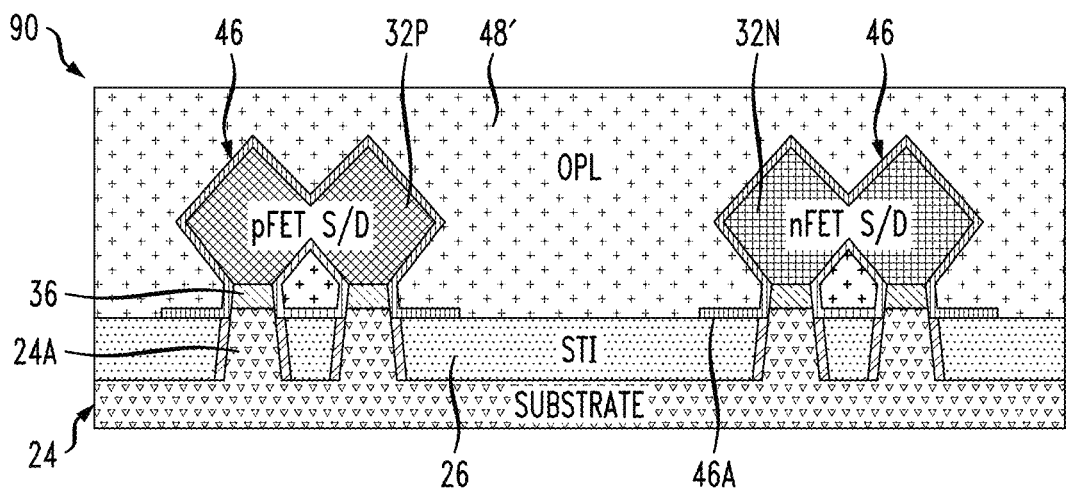
FIG. 9A is a schematic, cross-sectional view of the structure as shown in FIG. 8A following selective chamfering of the metal liner on the gates thereof.
Figure 9B:
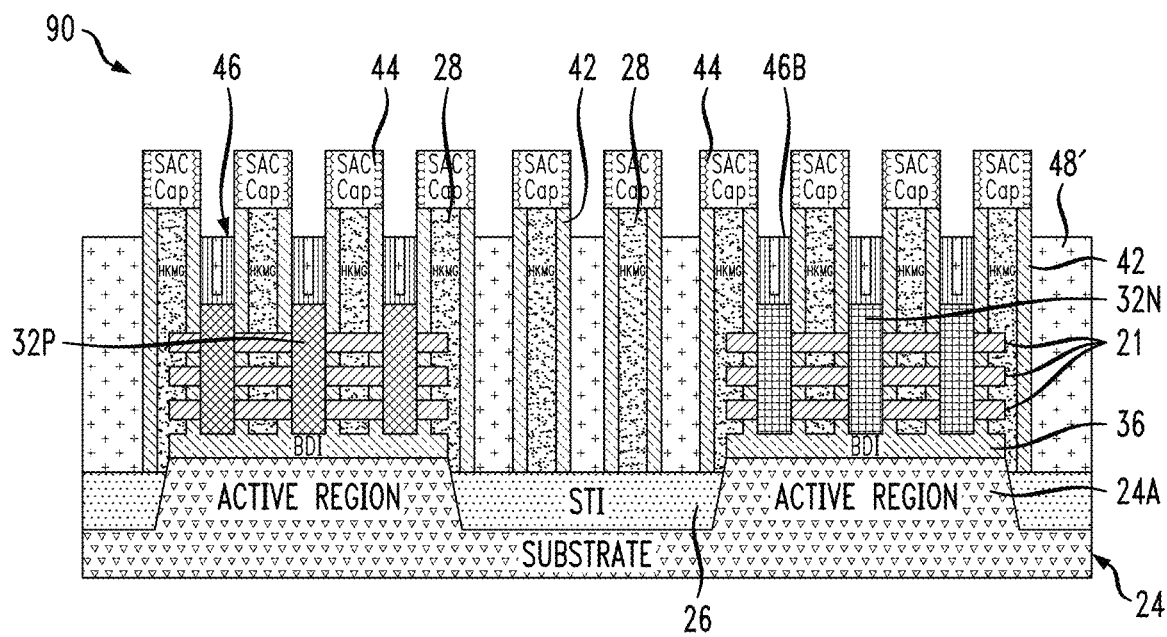
FIG. 9B is a schematic, cross-sectional view of the structure as shown in FIG. 8B following selective chamfering of the metal liner on the gates thereof.

Selective titanium chamfering causes removal of the exposed portions of the titanium liner 46 above the top surface of the OPL 48'. As discussed above, the selective removal of titanium-based material may be conducted by a wet process using, for example, sulfuric peroxide mixture (SPM). A structure 90 as schematically illustrated in cross-section in FIGS. 9A and 9B may accordingly be obtained. The remaining vertical portions 46B of the titanium liner adjoin the gate sidewall spacers 42 and terminate below the gate caps 44. The gate structures 28, having top end portions adjoining the gate caps 44, extend above the vertical portions 46B of the titanium layer 46.

Figure 10A:
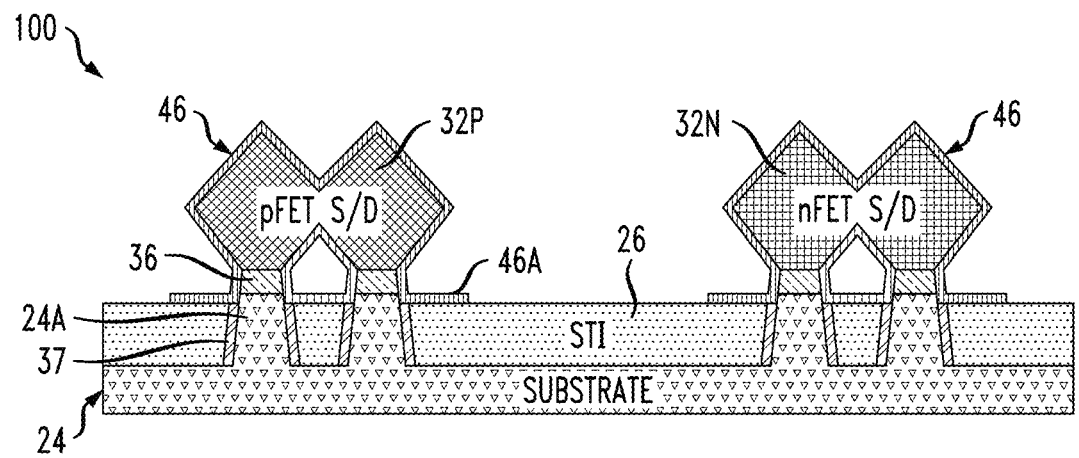
FIG. 10A is a schematic, cross-sectional view of the structure as shown in FIG. 9A following removal of the OPL.
Figure 10B:
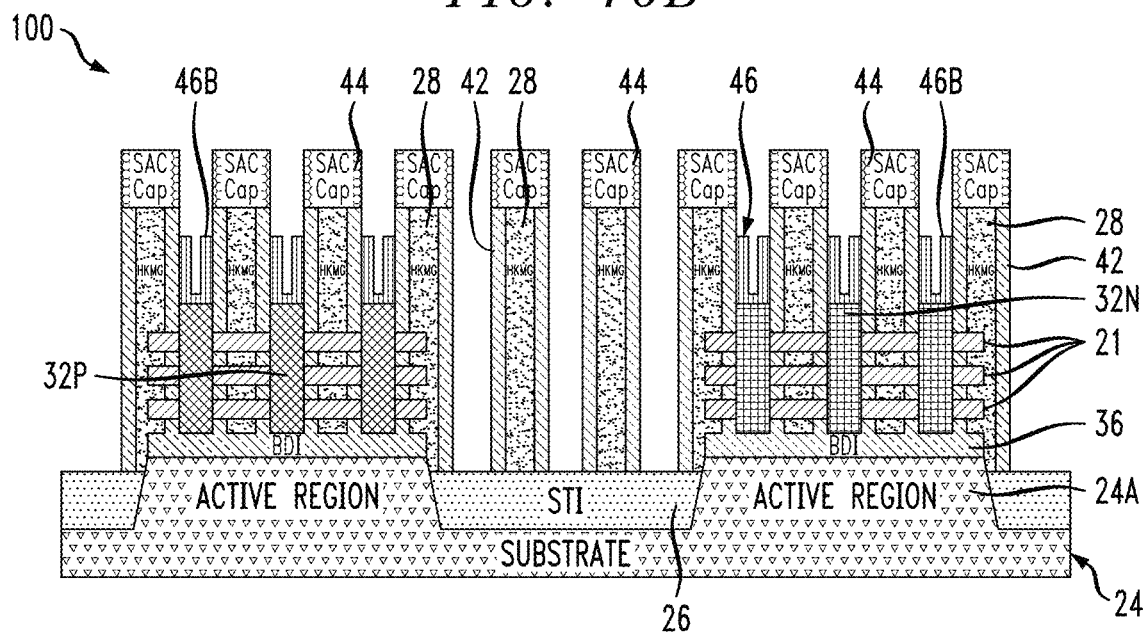
FIG. 10B is a schematic, cross-sectional view of the structure as shown in FIG. 9B following removal of the OPL.

The second OPL 48' may be removed by ashing or other suitable process to obtain a structure 100 as schematically illustrated in cross-section in FIGS. 10A and 10B. The liner 46 now comprises a plurality of discrete, contiguous segments, each segment including a metal silicide portion and metal portions extending from the silicide portion. As shown in FIG. 10A, the titanium silicide portions of the liner 46 wrap around the source/drain regions 32P, 32N. Laterally extending metal (non-silicide) portions 46A of the liner 46 extend a limited distance horizontally from sub-fin regions below the bottom dielectric isolation layer 36 and over portions of the STI region 26. As discussed above, the laterally extending portions 46A of the liner 46 segments further extend laterally beyond the source/drain regions 32P, 32N of the associated field-effect transistors. Vertical portions 46B of the titanium liner 46 segments are localized between pairs of the gate structures 28, as illustrated in FIG. 10B. Each vertical portion 46B includes a pair of metal segments adjoining gate sidewall spacers 42. The vertical portions 46B are located entirely beneath the top surfaces of the gate structures 28 and the gate caps 44.

An interlevel dielectric (ILD) layer 52 is deposited on the structure 90 and planarized. The ILD layer may be deposited using, for example, deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), spin-on coating, sputtering, and/or plating. The ILD layer 52 may include, but is not limited to, low-k materials (e.g., k less than about 4.0), such as, for example, porous silicates, carbon doped oxides, silicon dioxides, silicon oxynitrides, carbon-doped silicon oxide (SiCOH) and porous variants thereof, silsesquioxanes, siloxanes, or other dielectric materials having, for example, a dielectric constant in the range of about 2 to about 4.

Figure 11A:
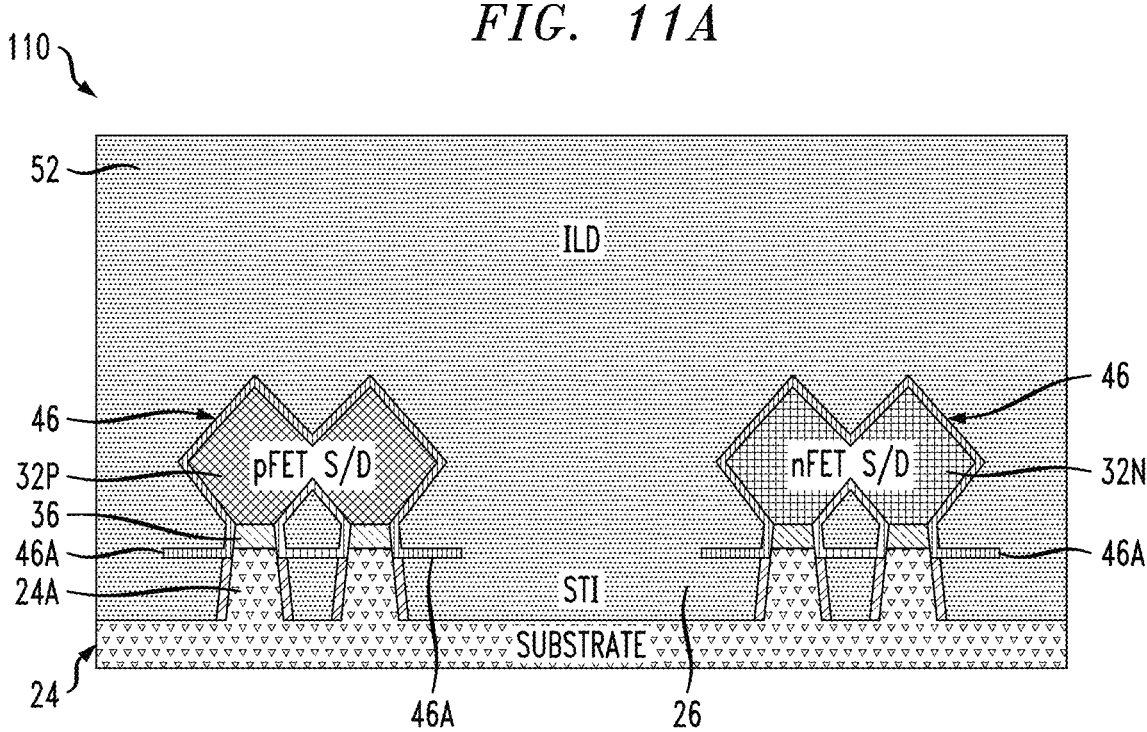
FIG. 11A is a schematic, cross-sectional view of the structure as shown in FIG. 10A following deposition and planarization of an interlevel dielectric (ILD) layer thereon.
Figure 11B:
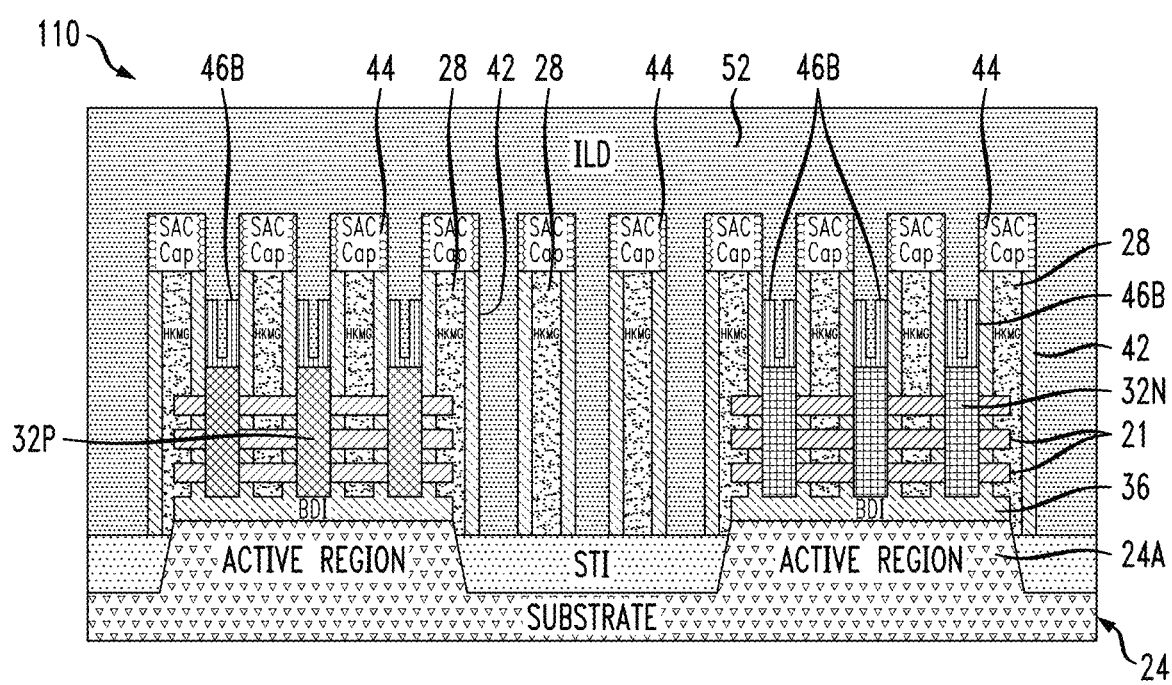
FIG. 11B is a schematic, cross-sectional view of the structure as shown in FIG. 10B following deposition and planarization of an ILD layer thereon.

The interlevel dielectric (ILD) layer 52 is conformally deposited on the structure 90, thereby filling the spaces between the elements comprising the nFETs and pFETs above the substrate 24. The interlevel dielectric layer may, for example, comprise a conformal oxide such as ALD silicon dioxide in one exemplary embodiment. Flowable ILD materials may be employed in one or more embodiments. A substantially carbon free silicon oxide ($SiO_2$) material can, for example, be deposited using FCVD. Flowable chemical vapor deposition (FCVD) provides for a liquid-like film that flows freely into trench-like geometries to provide a bottom up, void-free and seam-free fill. Other dielectric materials may alternatively be employed in some embodiments, though etch selectivity between the ILD layer 52 and the gate sidewall spacers 42, the gate caps 44 and the metal silicide should be provided. The ILD layer 52 can be optionally cured using various known curing techniques including UV-light-assisted cure at below 400° C. The resulting structure is then subjected to chemical mechanical planarization (CMP). A structure 110 as schematically illustrated in FIGS. 11A and 11B can thereby be obtained wherein the horizontal portions 46A of the metal liner 46 are localized between the ILD layer 52 and the STI region 26.

Figure 12A:
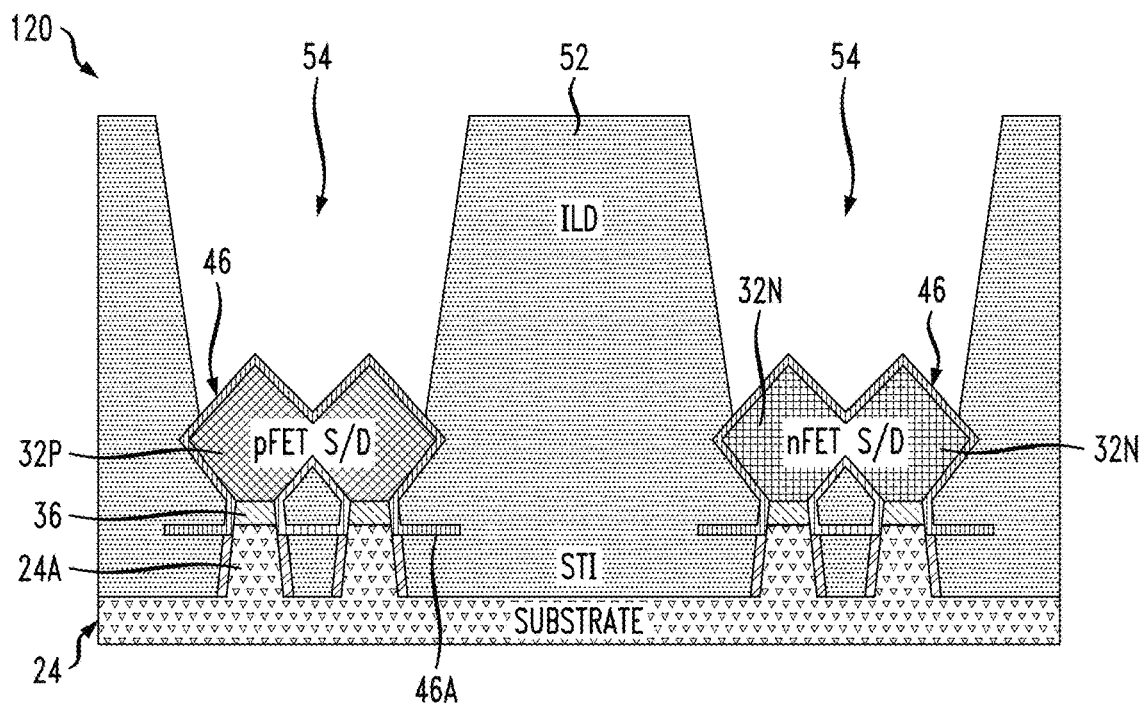
FIG. 12A is a schematic, cross-sectional view of the structure as shown in FIG. 11A following contact trench formation in the ILD layer.
Figure 12B:
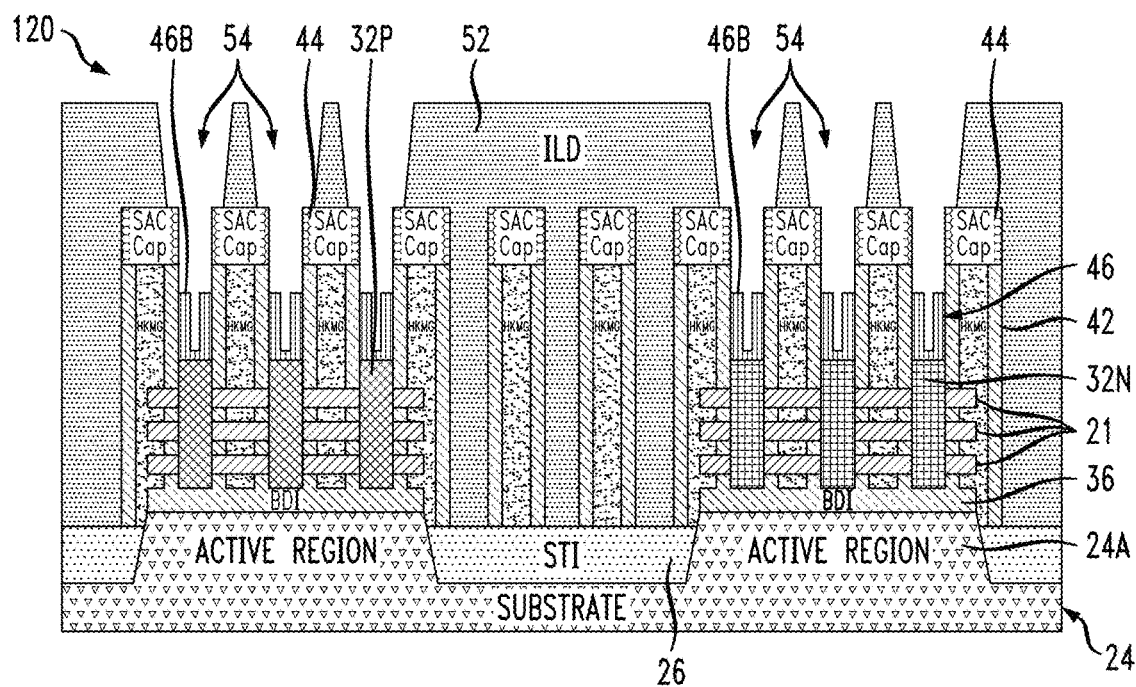
FIG. 12B is a schematic, cross-sectional view of the structure as shown in FIG. 11B following contact trench formation in the ILD layer.

Trench openings are conventionally formed in an ILD layer 52 by using, for example, known damascene techniques. Photolithography and etching steps follow ILD layer deposition. Specifically, a photoresist (not shown) is applied over the ILD layer. The photoresist can be applied by any suitable technique, including, but not limited to coating or spin-on techniques. A mask (not shown), which is patterned with shapes defining trench openings and/or contact holes to be formed, is provided over the photoresist, and the mask pattern is transferred to the photoresist using a photolithographic process, which creates recesses in the uncovered regions of the photoresist. The patterned photoresist is subsequently used to create the same pattern of recesses in the ILD dielectric layer through conventional etching typically used for forming trenches and contact holes. A dry etch (for example, a reactive ion etch) may be employed to form such trenches and contact holes. The etching selectively removes a portion of the ILD layer 52. After formation of the trench openings 54, the photoresist may be stripped by ashing or other suitable process from the ILD layer. The resulting structure 120, as schematically illustrated in FIGS. 12A and 12B, may be subjected to a wet clean.

Figure 13A:
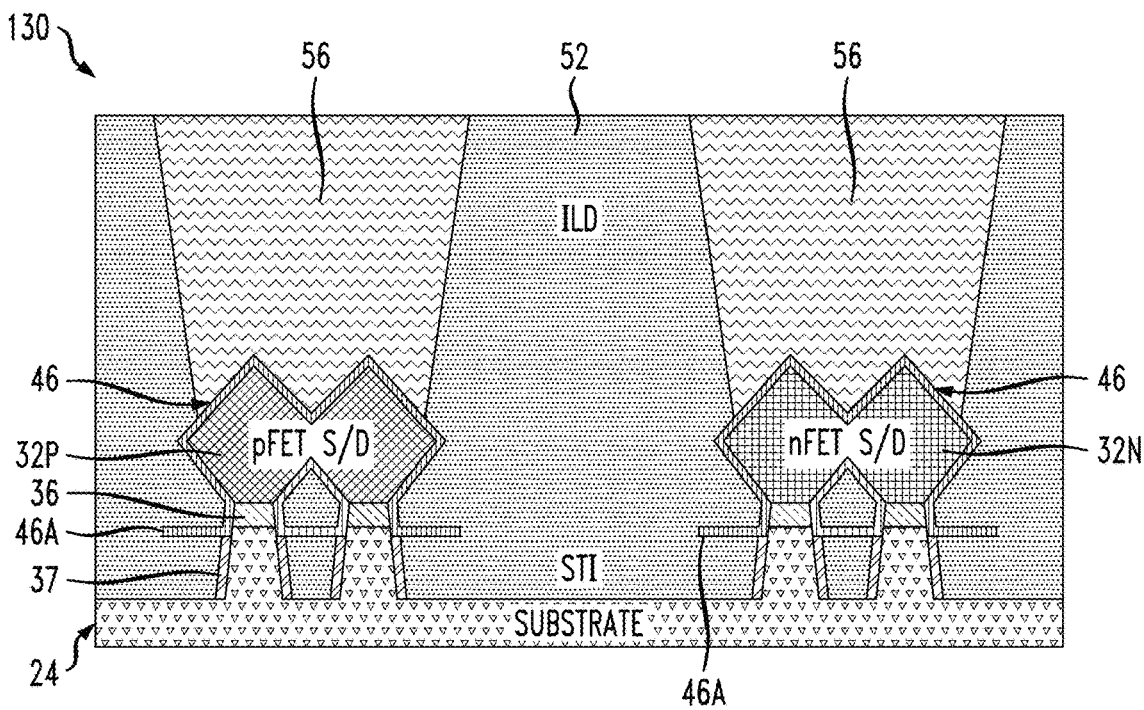
FIG. 13A is a schematic, cross-sectional view of the structure as shown in FIG. 12A following contact metallization.
Figure 13B:
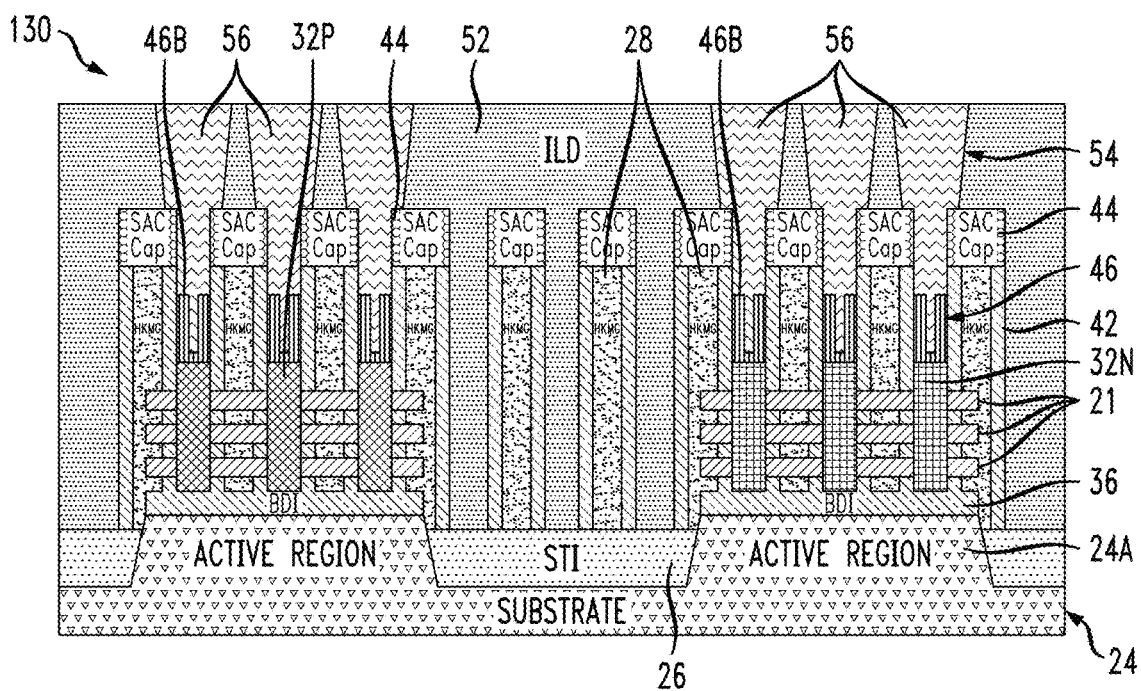
FIG. 13B is a schematic, cross-sectional view of the structure as shown in FIG. 12B following contact metallization.

After the resist is stripped, the trench (via) openings are cleaned and then lined with, for example, a thin PVD (e.g. sputtered) titanium (Ti) layer (not shown). The Ti film serves as an adhesion layer and also decreases contact resistance to underlying conductors by reducing interfacial oxides. Titanium nitride (TiN) (not shown) is subsequently deposited either by sputtering or by CVD. A contact metal layer 56, for example tungsten (W) or cobalt (Co), is conformally deposited on the structure, filling the trenches 54 formed the ILD layer 52 and directly contacting the metal silicide and/or metal germano-silicide layers formed on the source/drain regions 32N, 32P from the metal liner 46. The vertically extending portions 46B of the liner are also in contact with the metal contact layer 56, as shown in FIG. 13B. In some embodiments, the contact metal layer is a tungsten (W) layer that is deposited using a tungsten hexafluoride source with silane. Chemical vapor deposition conducted between 300-400° C. and using tungsten hexafluoride precursor chemistry may, for example, be employed to deposit a tungsten layer. Contact material may, for example, alternatively include tantalum (Ta), aluminum (Al), platinum (Pt), gold (Au), titanium (Ti), palladium (Pd) or any combination thereof. The contact material may be deposited by, for example, CVD, PECVD, PVD, plating, thermal or e-beam evaporation, or sputtering. A structure 130 as schematically illustrated in FIGS. 13A and 13B may be obtained following trench silicide metallization as describe above.

Figure 14A:
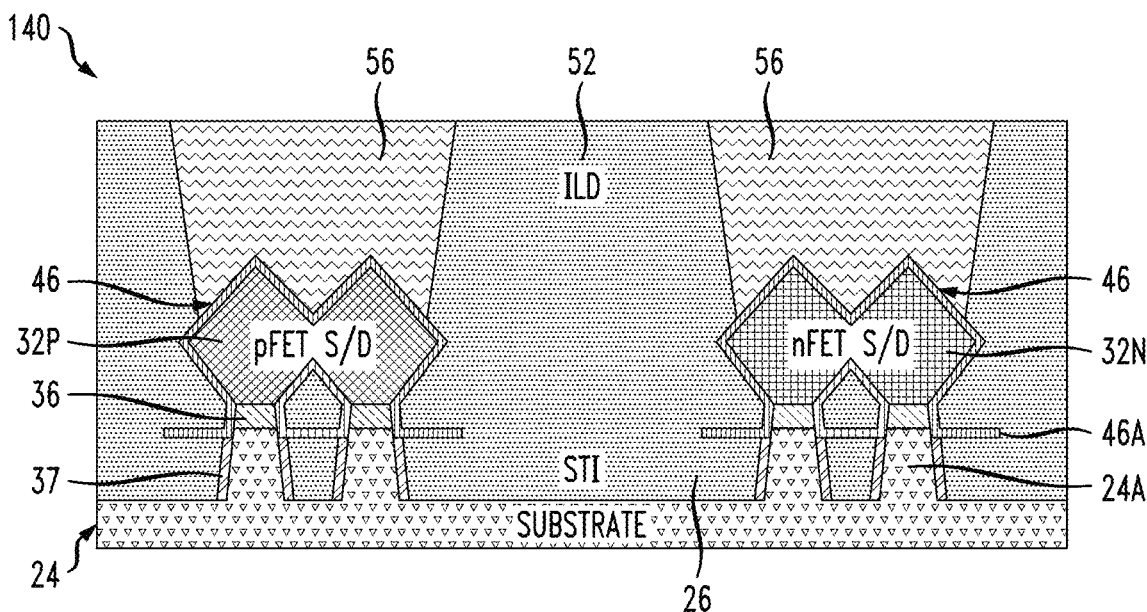
FIG. 14A is a schematic, cross-sectional view of the structure as shown in FIG. 13A following planarization.
Figure 14B:
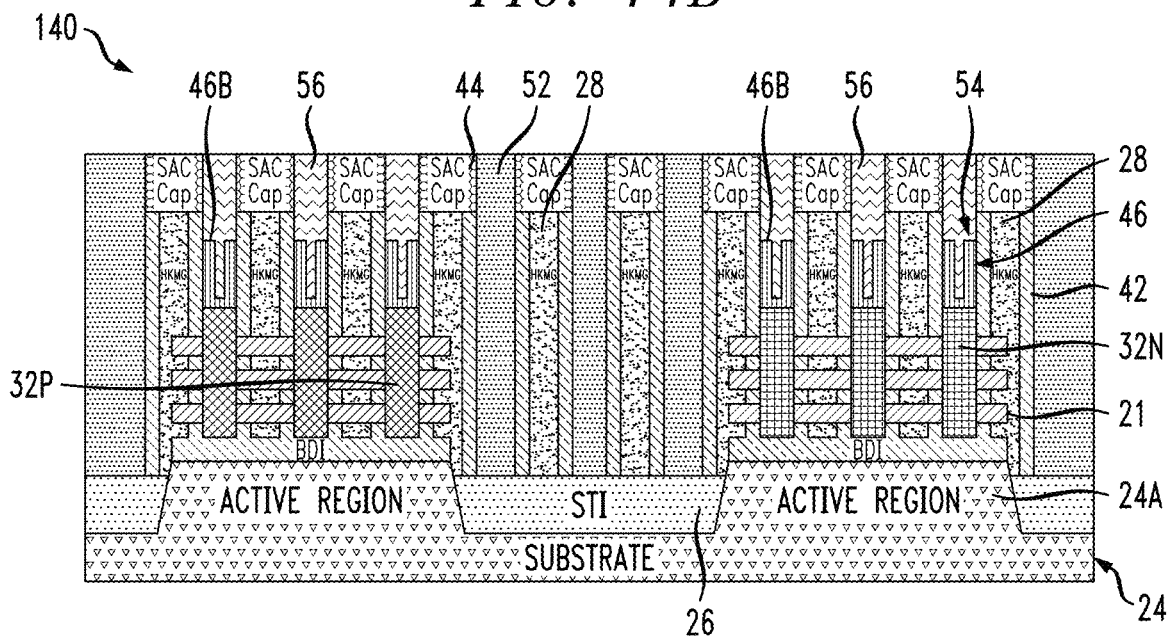
FIG. 14B is a schematic, cross-sectional view of the structure as shown in FIG. 13B following planarization.

A planarization process such as CMP is performed to remove any electrically conductive material (overburden) from the top surface of the structure. The thickness of the ILD layer 52 may also be reduced using CMP to obtain a structure 140 as schematically illustrated in FIGS. 14A and 14B. As shown in FIG. 14A, metal silicide wraps around the source/drain regions 32P, 32N. As shown in FIG. 14B, the metal silicide around the source/drain regions and the contiguous portions 46B of the liner 46 extending above the source/drain regions are localized between the gate structures 28. All remaining portions of the liner 46 are located beneath the top surfaces of the gate structures 28. A semiconductor structure 140 including gate-all-around (GAA) architecture, wrap-around source/drain contacts, and localized metal/silicide may be provided. Moreover, the combination of block mask patterning and chamfering to fabricate such a structure obviates the need for inverse tone patterning.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., Silicon VLSI Technology: Fundamentals, Practice, and Modeling Pt Edition, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Figure 3A:
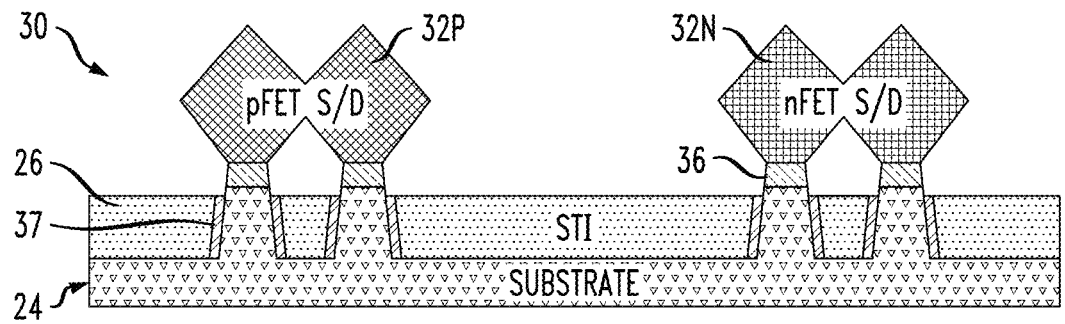
FIG. 3A is a schematic, cross-sectional view of the structure as shown in FIG. 2A following removal of a contact etching stop layer (CESL)
Figure 3B:
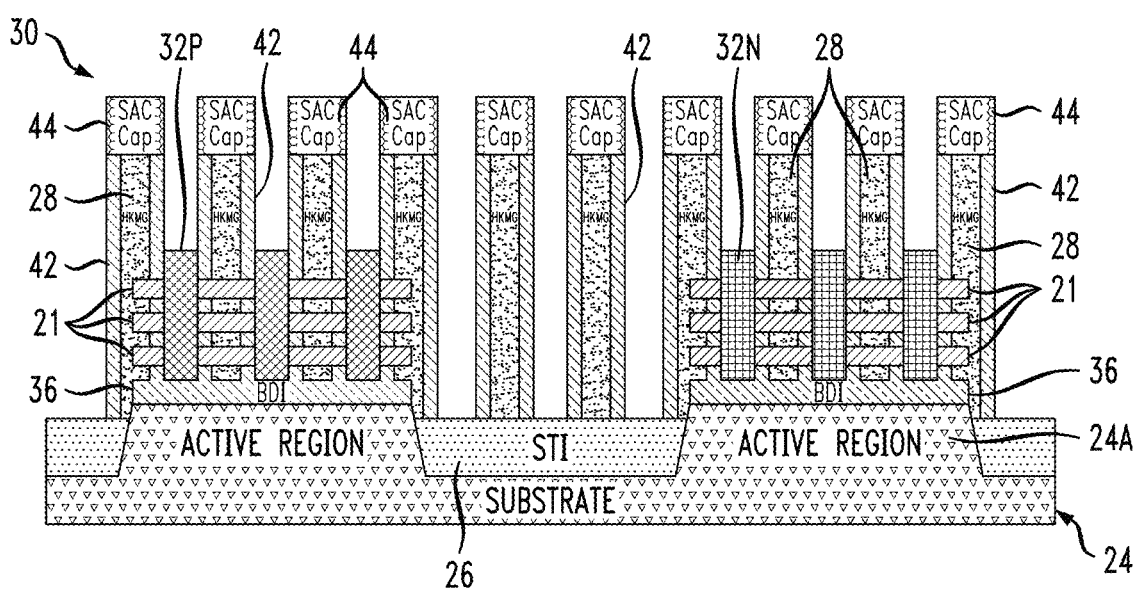
FIG. 3B is a schematic, cross-sectional view of the structure as shown in FIG. 2B following removal of a contact etching stop layer (CESL)

Given the discussion thus far, it will be appreciated that, in general terms, an exemplary method of forming a semiconductor structure including wrap-around contacts includes conformally depositing a metal liner on a monolithic structure that includes first and second active regions 24A and field-effect transistors (FETs) on the first and second active regions. FIGS. 3A and 3B show an exemplary monolithic structure 30 including nanosheet FETs. The FETs include gate structures 28 and epitaxial source/drain regions 32P and/or 32N. A metal silicide liner is formed on the epitaxial source/drain regions from the metal liner and wraps around the source/drain regions. The first and second active regions are protected with a patterned block mask 48 as schematically illustrated in FIGS. 5A and 5B. The metal liner is selectively removed from a region exposed by the patterned block mask between the first and second active regions. A structure 70 as shown in FIGS. 7A and 7B is obtained following removal of the patterned block mask 48. As schematically illustrated in FIGS. 8A and 8B, a protective mask 48' is formed on the monolithic structure. The protective mask protects the epitaxial source/drain regions, which are entirely beneath the top surface of the protective mask. Portions of the metal liner 46 above the first and second active regions are exposed. The exposed portions of the metal liner 46 above the active regions are removed followed by removal of the protective mask 48'. A monolithic semiconductor structure 100 as shown in FIGS. 10A and 10B may accordingly be obtained, it being appreciated that the exemplary method can be applied with respect to nanosheet transistors as shown as well as other types of FETs such as FinFETs.

In an exemplary embodiment, forming the protective mask includes depositing an organic planarization layer on the monolithic structure and etching back the organic planarization layer to expose the top portions of the gate structures 28 and associated gate sidewall spacers 42 and gate caps 44. The method may include forming an interlevel dielectric layer 52 on the monolithic structure, patterning the interlevel dielectric layer, thereby exposing the metal silicide liner on the epitaxial source/drain regions 32P, 32N as shown in FIGS. 12A and 12B, and forming metal contacts 56 within the interlevel dielectric layer and directly contacting the metal silicide liner on the epitaxial source/drain regions. FIGS. 13A and 13B illustrate an exemplary structure 130 following contact metallization. The monolithic structure 30 in one or more exemplary embodiments further includes gate caps 44 and gate sidewall spacers 42 adjoining the gate structures, wherein selectively removing the metal liner 46 above the top portions of the gate structures includes removing the metal liner from the gate caps and portions of the gate sidewall spacers. The monolithic structure includes a shallow trench isolation region 26 in one or more embodiments, wherein selectively removing the metal liner 46 from a region between the first and second active regions includes removing the metal liner from a top surface of the shallow trench isolation region 26.

A semiconductor structure provided in accordance with one or more embodiments includes a semiconductor substrate 24 including a first active region 24A and a second active region 24A and a shallow trench isolation region 26 between the first active region and the second active region. A first field-effect transistor on the first active region includes a gate structure 28 on the first active region, a channel region (the region of layer 21 adjoining the gate structure), and a pair of epitaxial source/drain regions 32P or 32N on opposite sides of the channel region. Each epitaxial source/drain region is located between a pair of gate structures on the first active region. A wrap-around metal silicide liner (the silicide portion of conformal metal layer 46) adjoins each epitaxial source/drain region of the first field-effect transistor. A dielectric layer 52 extends over the semiconductor substrate and the first field-effect transistor. Metal liner portions are contiguous, respectively, with each metal silicide liner. Each metal liner portion includes a vertically extending portion 46B located between a pair of the gate structures 28 on the first active region and extending above the source/drain regions. The gate structures 28 on the first active region extend vertically above the vertically extending portion 46B. A horizontally extending metal liner portion 46A extends below the source/drain regions of the first field-effect transistor and is positioned between the shallow trench isolation region 26 and the dielectric layer 52. As shown, for example, in FIG. 14A the horizontally extending portion 46A of each metal liner portion extends laterally beyond one of the source/drain regions of the first field-effect transistor directly above.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having nanosheet or other FET devices having wrap-around contacts formed in accordance with one or more of the exemplary embodiments.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (ME), which are all known techniques to remove select material when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown.

Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure comprising:
   a semiconductor substrate including a first active region and a second active region;
   a shallow trench isolation region between the first active region and the second active region;
   a plurality of gate structures on the first active region;
   a first field-effect transistor on the first active region, the first field-effect transistor comprising one of the gate structures on the first active region, a channel region, and a pair of epitaxial source/drain regions on opposite sides of the channel region, each epitaxial source/drain region being located between a pair of the gate structures on the first active region;
   a wrap-around metal silicide liner adjoining each epitaxial source/drain region of the first field-effect transistor;
   a dielectric layer extending over the semiconductor substrate and the first field-effect transistor;
   metal liner portions contiguous, respectively, with each metal silicide liner, each metal liner portion including:
      a vertically extending portion located between a pair of the gate structures on the first active region and extending above the source/drain regions; and
      a horizontally extending portion below the source/drain regions of the first field-effect transistor and positioned between the shallow trench isolation region and the dielectric layer, the horizontally extending portion of each metal liner portion extending laterally beyond one of the source/drain regions of the first field-effect transistor.

2. The semiconductor structure of claim 1, further including:
a plurality of gate structures on the second active region;
a second field-effect transistor on the second active region, the second field-effect transistor comprising one of the gate structures on the second active region, a channel region, and a pair of epitaxial source/drain regions on opposite sides of the channel region, each epitaxial source/drain region being located between a pair of the gate structures, the dielectric layer extending over the second field-effect transistor;
a wrap-around metal silicide liner adjoining each epitaxial source/drain region of the second field-effect transistor;
metal liner portions contiguous, respectively, with each metal silicide liner of the second field-effect transistor, each metal liner portion including:
a vertically extending portion located between a pair of the gate structures on the second active region and extending above the source/drain regions of the second field-effect transistor, the gate structures on the second active region extending vertically above the vertically extending portion; and
a horizontally extending portion below the source/drain regions of the second field-effect transistor and positioned between the shallow trench isolation region and the dielectric layer, the horizontally extending portion of each metal liner portion extending laterally beyond one of the source/drain regions of the second field-effect transistor.

3. The semiconductor structure of claim 2, further including:
a plurality of vertically extending trenches within the dielectric layer; and
contact metal within the trenches and contacting the metal silicide liners adjoining the epitaxial source/drain regions of the first and second field-effect transistors.

4. The semiconductor structure of claim 3, wherein the first field-effect transistor and the second field-effect transistor are nanosheet transistors and the epitaxial source/drain regions comprise doped, faceted structures.

5. The semiconductor structure of claim 3, wherein the active regions comprise semiconductor fins.

6. The semiconductor structure of claim 5, further including a bottom dielectric isolation layer beneath the first field-effect transistor and the second field-effect transistor, each metal liner portion extending over an edge portion of the bottom dielectric isolation layer.

7. The semiconductor structure of claim 1, further including gate sidewall spacers on sidewalls of the gate structures, the vertically extending portions of the metal liner portions adjoining, respectively, the gate sidewall spacers, the gate structures on the first active region extending vertically above the vertically extending portions of the metal liner portions.

8. The semiconductor structure of claim 7, wherein the metal liner portions comprise titanium and the first field-effect transistor is a nanosheet transistor or a FinFET transistor.

9. A semiconductor structure comprising:
a semiconductor substrate including a first active region and a second active region;
a plurality of parallel gate structures extending across the semiconductor substrate;
a first field-effect transistor on the first active region, the first field-effect transistor comprising one of the gate structures, a channel region, and a first pair of epitaxial source/drain regions on opposite sides of the channel region, each epitaxial source/drain region being located between a first pair of the gate structures;
a second field-effect transistor on the second active region, the second field-effect transistor comprising one of the gate structures, a channel region, and a second pair of epitaxial source/drain regions on opposite sides of the channel region, each epitaxial source/drain region being located between a second pair of the gate structures;
a dielectric layer encasing the first field-effect transistor and the second field-effect transistor;
a metal silicide liner wrapped around each of the source/drain regions;
a conformal metal liner extending from and contiguous with each metal silicide liner, each conformal metal liner including a vertically extending portion confined between one of the first and second pairs of the gate structures and extending vertically above one of the source/drain regions, the first and second pairs of the gate structures extending vertically above the vertically extending portion of each conformal metal liner; and
source/drain contact metal extending vertically through the dielectric layer and contacting the metal silicide liner.

10. The semiconductor structure of claim 9, wherein the channel region of each of the first transistor and the second transistor includes a plurality of vertically stacked channel layers.

11. The semiconductor structure of claim 9, wherein each of the gate structures includes gate sidewall spacers, and further wherein the vertically extending portion of each conformal metal liner includes a pair of vertical segments, each vertical segment adjoining one of the gate sidewall spacers, the gate sidewall spacers extending vertically above the pairs of vertical segments.

12. A semiconductor structure comprising:
a semiconductor substrate including a first active region and a second active region;
a plurality of parallel gate structures extending across the semiconductor substrate;
a first field-effect transistor on the first active region, the first field-effect transistor comprising one of the gate structures, a channel region, and a first pair of epitaxial source/drain regions on opposite sides of the channel region, each epitaxial source/drain region being located between a first pair of the gate structures;
a second field-effect transistor on the second active region, the second field-effect transistor comprising one of the gate structures, a channel region, and a second pair of epitaxial source/drain regions on opposite sides of the channel region, each epitaxial source/drain region being located between a second pair of the gate structures;
a dielectric layer encasing the first field-effect transistor and the second field-effect transistor;
a metal silicide liner wrapped around each of the source/drain regions;
a conformal metal liner extending from and contiguous with each metal silicide liner, each conformal metal liner including a vertically extending portion confined between one of the first and second pairs of the gate structures and extending vertically above one of the source/drain regions, the first and second pairs of the gate structures extending vertically above the vertically extending portion of each conformal metal liner; and source/drain contact metal extending vertically through the dielectric layer and contacting the metal silicide liner;

wherein each of the gate structures includes gate sidewall spacers, and further wherein the vertically extending portion of each conformal metal liner includes a pair of vertical segments, each vertical segment adjoining one of the gate sidewall spacers; and wherein each conformal metal liner includes a horizontal segment extending beneath the dielectric layer and laterally beyond one of the source/drain regions.

13. The semiconductor structure of claim 12, further including a shallow trench isolation region beneath the dielectric layer and laterally between the first active region and the second active region, the horizontal segment of each conformal metal liner extending between the dielectric layer and the shallow trench isolation region.

14. A method of forming a semiconductor structure including wrap-around contacts, comprising:
conformally depositing a metal liner on a monolithic structure, the monolithic structure including:
first and second active regions; and
field-effect transistors on the first and second active regions including gate structures and epitaxial source/drain regions;
forming a metal silicide liner on and wrapping around the epitaxial source/drain regions from the metal liner;
protecting the first and second active regions with a patterned block mask;
selectively removing the metal liner from a region exposed by the patterned block mask between the first and second active regions;
removing the patterned block mask;
forming a protective mask on the monolithic structure such that the epitaxial source/drain regions are entirely beneath the top surface of the protective mask and portions of the metal liner above the first and second active regions are exposed;
selectively removing the exposed portions of the metal liner above the first and second active regions; and
removing the protective mask.

15. The method of claim 14, wherein the forming the protective mask includes:
depositing an organic planarization layer on the monolithic structure; and
etching back the organic planarization layer such that portions of the gate structures extend above the top surface of the protective mask.

16. The method of claim 15, further including:
forming an interlevel dielectric layer over the active regions;
patterning the interlevel dielectric layer, thereby exposing the metal silicide liner on the epitaxial source/drain regions;
forming metal contacts within the interlevel dielectric layer and directly contacting the metal silicide liner on the epitaxial source/drain regions.

17. The method of claim 16, wherein the monolithic structure further includes gate caps and gate sidewall spacers adjoining the gate structures, further wherein selectively removing the exposed portions of the metal liner above the first and second active regions includes removing the metal liner from the gate caps and top portions of the gate sidewall spacers.

18. The method of claim 17, wherein the monolithic structure includes a shallow trench isolation region between the first and second active regions, further wherein selectively removing the metal liner from a region between the first and second active regions includes removing the metal liner from a top surface of the shallow trench isolation region.

19. The method of claim 18, wherein the monolithic structure further includes a contact etch stop liner extending over the first and second active regions and the shallow trench isolation region, further including:
removing the contact etch stop liner and replacing the contact etch stop liner with the metal liner.

20. The method of claim 18, wherein the field-effect transistors include nanosheet transistors or FinFET transistors.

21. The method of claim 14, wherein the field-effect transistors include nanosheet transistors or FinFET transistors and the epitaxial source/drain regions comprise doped, faceted semiconductor regions, further wherein conformally depositing the metal liner causes the metal liner to wrap around the doped, faceted semiconductor regions.

22. The method of claim 21, wherein the patterned block mask completely covers and extends laterally beyond the epitaxial source/drain regions.

23. The method of claim 22, wherein:
the monolithic structure further includes gate caps and gate sidewall spacers adjoining the gate structures;
forming the protective mask includes depositing an organic planarization layer on the monolithic structure and etching back the organic planarization layer, thereby exposing the gate caps and top portions of the gate sidewall spacers; and
selectively removing the exposed portions of the metal liner above the first and second active regions includes removing the metal liner from the gate caps and the top portions of the gate sidewall spacers.

24. A method of forming a semiconductor structure including wrap-around contacts, comprising:
obtaining a monolithic structure including:
first and second active regions;
field-effect transistors on the first and second active regions including gate structures, gate caps above the gate structures, gate sidewall spacers on sidewalls of the gate structures, and epitaxial source/drain regions between pairs of gate structures; and
a contiguous liner including first liner portions on and wrapping around the epitaxial source/drain regions and a metal liner extending between the first and second active regions and over the gate caps and gate sidewall spacers;
protecting the first and second active regions with a patterned block mask;
selectively removing the metal liner from a region exposed by the patterned block mask between the first and second active regions;
removing the patterned block mask;
forming a protective mask on the monolithic structure such that the gate caps and top portions of the gate sidewall spacers extend above a top surface of the protective mask and the epitaxial source/drain regions are beneath the top surface of the protective mask;
selectively removing the metal liner from the top portions of the gate sidewall spacers and the gate caps; and
removing the protective mask.

25. The method of claim 24, wherein the field-effect transistors comprise nanosheet transistors or FinFET transistors, further including:
- forming metal silicide liners from the first liner portions;
- forming an interlevel dielectric layer over the first and second active regions;
- patterning the interlevel dielectric layer, thereby exposing the metal silicide liners on the epitaxial source/drain regions; and
- forming metal contacts within the interlevel dielectric layer and directly contacting the metal silicide liners on the epitaxial source/drain regions.

* * * * *